United States Patent [19]

Benson et al.

[11] Patent Number: 5,372,262
[45] Date of Patent: Dec. 13, 1994

[54] FRAME ASSEMBLY FOR RACK-MOUNTABLE EQUIPMENT

[75] Inventors: John M. Benson, Westwood; James E. Fritscher, Barre, both of Mass.

[73] Assignee: Digital Equipment Corporation, Maynard, Mass.

[21] Appl. No.: 723,396

[22] Filed: Jun. 28, 1991

[51] Int. Cl.$^5$ .................................................. A47F 7/00
[52] U.S. Cl. .................... 211/26; 280/79.3; 312/265.4; 211/189
[58] Field of Search .............. 361/383, 429, 428, 424; 174/35 R; 211/26, 189; 108/50, 56.1, 56.3; 280/79.3, 763.1, 43.2; 312/250, 265.1, 265.2, 265.3, 265.4

[56] References Cited

U.S. PATENT DOCUMENTS

| | | | |
|---|---|---|---|
| 2,926,022 | 2/1960 | Nau et al. | 280/79.3 |
| 3,034,844 | 5/1962 | Anderson et al. | 312/265.4 |
| 3,265,419 | 8/1966 | Durnbaugh et al. | 312/265.14 |
| 3,305,623 | 2/1967 | Bakker et al. | 174/35 MS |
| 3,541,395 | 11/1970 | Lucchino | 361/383 |
| 3,966,285 | 6/1976 | Porch et al. | 312/265.4 |
| 4,131,934 | 12/1978 | Becker et al. | 261/428 |
| 4,497,411 | 2/1985 | De Bortoli | 361/429 |
| 4,643,319 | 2/1987 | Debus et al. | 211/189 |
| 4,777,565 | 10/1988 | McIntosh | 312/265.5 X |
| 4,988,008 | 1/1991 | Blum et al. | 211/26 X |
| 4,997,240 | 3/1991 | Schmalzl et al. | 312/265.4 |
| 5,016,765 | 5/1991 | Leonardo | 211/189 |
| 5,049,701 | 9/1991 | Volules et al. | 361/424 |

FOREIGN PATENT DOCUMENTS

| | | | |
|---|---|---|---|
| 2448239 | 10/1980 | France | 361/429 |
| 379714 | 8/1964 | Switzerland | 312/265.4 |
| 928483 | 5/1982 | U.S.S.R. | 361/429 |

OTHER PUBLICATIONS

Digital Equipment Corporation H9544–JA Expansion Cabinet Kit, pp. 1–2.

Primary Examiner—David A. Scherbel
Assistant Examiner—Korie H. Chan
Attorney, Agent, or Firm—Denis G. Maloney; Albert P. Cefalo

[57] ABSTRACT

A frame assembly for rack-mountable components. A rectangular top frame having a tubular perimeter is connected by four vertical rails to a bottom frame which also has a tubular perimeter as well as tubular members which span it. Both and top and bottom frames each provide an unobstructed central area which may be used for ventilation or application of electromagnetic shielding.

33 Claims, 6 Drawing Sheets

FRAME ASSEMBLY FOR RACK-MOUNTABLE EQUIPMENT

BACKGROUND OF THE INVENTION

1. Field of the Invention

The present invention relates generally to the field of cabinets or enclosures for housing electronic equipment and, more specifically, to a load-bearing frame assembly for supporting rack-mountable devices such as computer components.

2. Discussion of the Prior Art

Electronic equipment such as computer components are often arranged in "drawers" or units having particular dimensions and fasteners which permit mounting within a vertical rack or load-bearing frame. Rack-mountable components are widely used because they are easily installed or removed and also permit flexible system configuration.

As various types of electronic equipment have become more complex, more densely packaged and more compact in size, vertical frames known in the prior art have proved deficient or disadvantageous in several ways. First, many such frames simply do not provide sufficient static payload capacity or do not provide sufficient capacity in combination with other desired attributes. For example, it may be highly desirable for purposes of reducing storage and shipping costs that the frame have a "knockdown" characteristic in which the frame remains disassembled prior to installation (i.e., during storage and shipping), but is quickly and easily assembled using simple tools and fasteners. Moreover, many frames which are mounted on casters for "roll-in" installation do not possess sufficient torsional stability or dynamic payload capacity to move heavier loads.

Also, as electronic components become more densely packed, more heat is generated and ventilation becomes critically important to ensure that the components will function properly. Prior art frames designed for use with less densely packed components are often not able to accommodate larger ventilation grilles or fans due to interfering structural members.

In addition, conventional frames often include small gaps or seams which are difficult to shield against electromagnetic emissions. Such gaps allow relatively high levels of such emissions to escape from the interiors of the cabinets. Consequently, conventional frames are often not compatible with modern, increasingly stringent regulations regarding permissible levels of electromagnetic emissions.

Finally, many conventional frames include structural members which, because of location or orientation, place severe restrictions on the design of exterior panels, doors, grilles and the like.

SUMMARY OF THE INVENTION

In brief summary, the present invention provides a load-bearing frame assembly which is suitable for use with cabinets or enclosures in which rack-mountable equipment is housed. The frame assembly provides increased payload capacity and torsional stability, may be shipped and stored disassembled, and is easily assembled using conventional fasteners and tools. The frame assembly provides enhanced flexibility with respect to ventilation, electromagnetic shielding and outward appearance.

The assembly includes top and bottom frames connected together by four vertical rails. The top frame is formed as a panel having a tubular perimeter and four downwardly-extending vertical supports disposed, respectively, near the corners of the top frame and rigidly attached to the perimeter.

The bottom frame is formed as a tubular perimeter having two parallel tubular members which span its width and are rigidly attached to the perimeter. Four upwardly-extending vertical supports are rigidly attached to the bottom frame perimeter at locations which correspond with those of the top frame supports. Each such location lies between one of the members and an adjacent portion of the perimeter such that applied loads are distributed between the member and perimeter.

The vertical rails are attached to the top and bottom vertical supports. The cross-section of the vertical rails is shaped to engage and partly enclose the top and bottom vertical supports and to provide an increased moment of inertia and corresponding increase in stiffness. Each rail includes two vertically-extending, integral mounting flanges, each of which has a plurality of apertures for fastening rack-mountable components thereto. The vertical and horizontal spacing of the apertures and orientations of the mounting flanges are preferably chosen in accordance with standards for rack-mountable components. The ends of the vertical rails are preferably fitted with caps to shield against electromagnetic emissions.

When the top and bottom frames are fastened to the vertical rails, the tubular portions of the frames function as torsion bars which provide a high degree of stiffness and resistance to torsional flexing. In addition, the tubular portions of the bottom frame function as load-bearing members and are arranged to ensure that the load is evenly distributed over such members.

Both the top and bottom frames provide substantial central areas which may be opened or perforated to provide ventilation or may be used to mount a fan. These areas may also be fitted with electromagnetic shielding.

Each vertical area defined by an adjacent pair of rails and the top and bottom frames is completely open and free of any cross-brace or other obstruction. As a result, there is full access to the interior of the frame assembly from all sides, as well as substantial flexibility provided for the design of panels or doors which attach to the assembly.

The bottom frame provides suitable locations for mounting caster assemblies and, if desired, a laterally-extendable arm which may be used to increase the stability of the frame assembly for particularly heavy loads or during servicing.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION OF AN ILLUSTRATIVE EMBODIMENT

Figure 1:
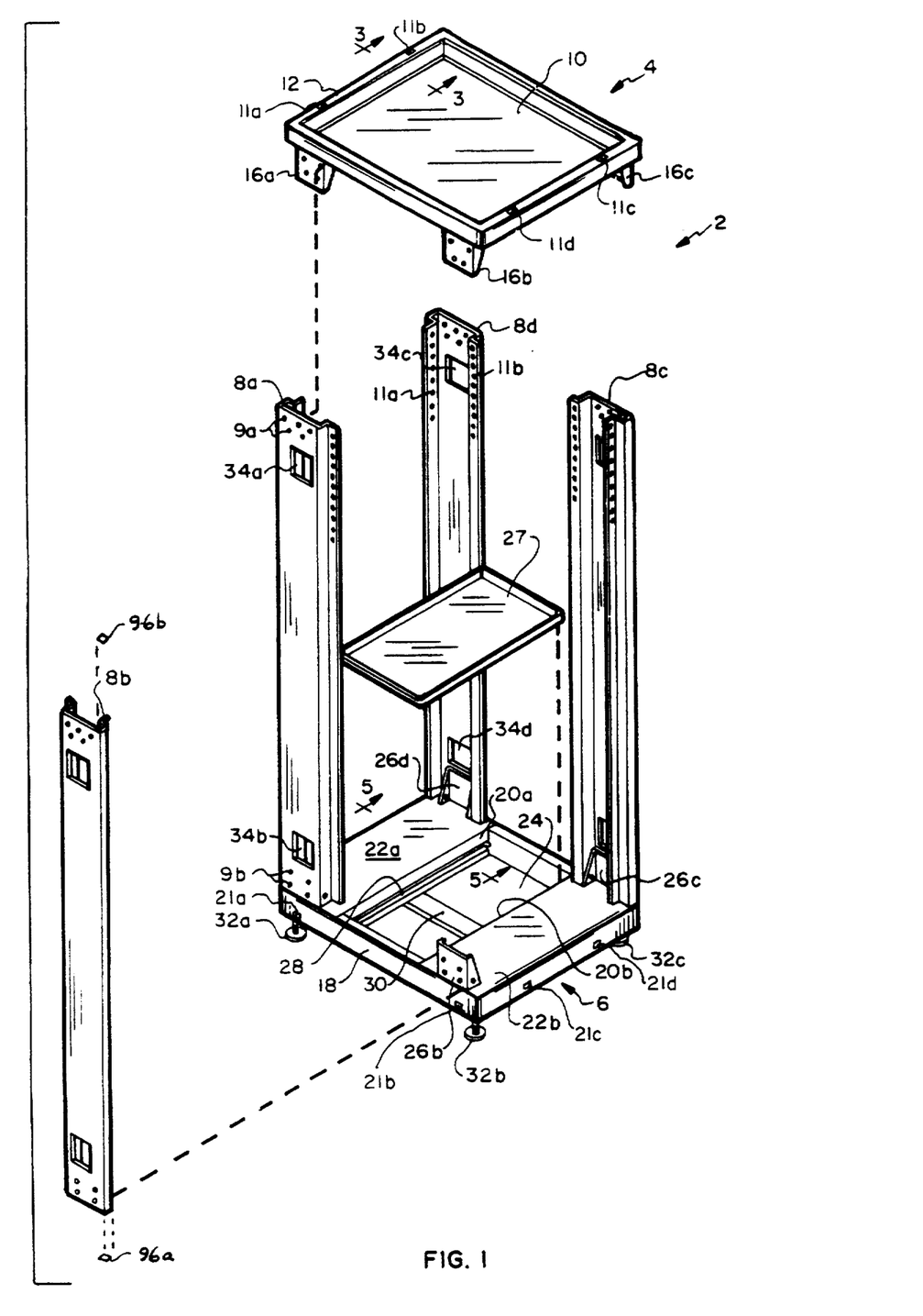
FIG. 1 is a perspective, partially exploded view of a frame assembly constructed in accordance with a preferred embodiment of the present invention.

FIG. 1 shows a partially disassembled frame assembly 2 which includes a top frame 4, a bottom frame 6, and four vertical rails 8a, 8b, 8c and 8d. For consistency and clarity, elements shown in later figures which correspond with elements of prior figures are designated by like reference numerals.

The top frame 4 includes a panel 10 having a tubular perimeter 12. Apertures 11a, 11b, 11c and 11d disposed in the top surface of perimeter 12 are available for securing a top cover or panel (not shown) to the frame 4. Three downwardly-extending vertical supports (a fourth one of which is hidden from view) 16a, 16b and 16c are rigidly attached to the bottom of the perimeter 12 and are shaped to engage with the rails 8. Each vertical support 16 includes a plurality of apertures for receiving conventional fasteners such as rivets.

The bottom frame 6 includes a tubular perimeter 18, two tubular members 20a and 20b, two surfaces 22a and 22b, a central open area 24 and three upwardly-extending vertical supports (a fourth being hidden from view) 26b, 26c and 26d which are similar to the vertical supports 16. Apertures 21a, 21b, 21c and 21d disposed around the outside of perimeter 18 are available for mounting a cover or skirt (not shown) to cover the gap between the bottom of frame 6 and the floor.

A panel 27, which is approximately the same size as the open area 24, is mountable on two brackets 28 (only one of which is visible) which are attached, respectively, to the sides of members 20. The panel 27 may be solid or, alternatively, perforated to provide ventilation through the bottom of the assembly 2. The panel 27 may also be removed so that the area 24 may be used to mount a fan, for example.

A stabilizer guide 30, which is partially visible through the open area 24, is attached to the bottom of the bottom frame 6. Conventional adjustable levelers 32a, 32b, 32c are disposed, respectively, near the corners of the bottom frame 6.

Preferably, rails 8a and 8c are identical (as are rails 8b and 8d) and the mirror image of rails 8b and 8d. Each rail 8 has a cross-section which is shaped to engage with one support 16 and one support 26. Each rail 8 includes two apertures, such as apertures 34a and 34b, which may serve, for example, as passageways for communication or power cables or the like. Each end of rails 8 includes a plurality of apertures, such as those denoted by reference numerals 9a and 9b, which correspond with similar apertures in the vertical supports 16 and 26, thus permitting the rails to be rigidly fastened to those supports by conventional fasteners such as rivets. In addition, each rail 8 includes two series of mounting apertures, like those denoted by reference numerals 11a and 11b, which are used for securing rack-mountable components to the rails 8.

When fully assembled, each "side" of assembly 2 (i.e., the vertical area between an adjacent pair rails 8 and the top and bottom frames) is open and unobstructed by any brace or structural element. One of the advantages of such open areas is that access may be gained to the interior of the assembly 2 from any side, after removal of a covering panel, which makes installation, removal and servicing of attached rack-mountable components much easier. Another advantage is that the open areas provide ready-made passageways for interconnecting cables or wires in applications where multiple enclosures or cabinets built with frames like assembly 2 are interconnected.

A typical frame assembly 2 is capable of supporting static loads of up to 2,000 pounds or more, depending upon choice of materials. As described in detail below, most of the components of assembly 2 are preferably made from flat metal stock using conventional techniques.

Figure 2A:
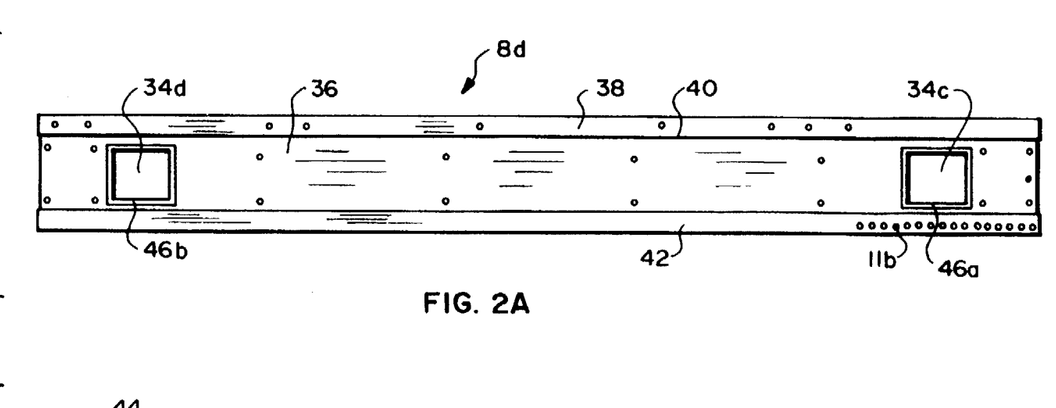
FIG. 2A is a side view of one of the vertical rails shown in FIG. 1.
Figure 2B:
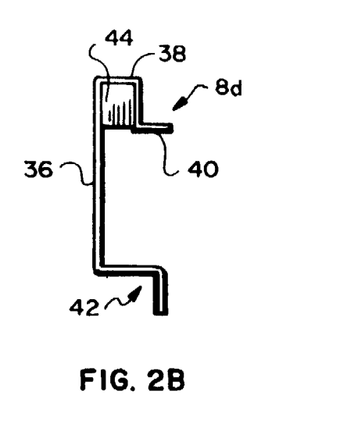
FIG. 2B is an end view of the rail in FIG. 2A.

In FIGS. 2A and 2B, one of the vertical rails 8d is shown in enlarged detail. One edge of a flat center portion 36 is integrally connected with a U-shaped flange 38, which extends the full length of the rail 8a. The flange 38 is in turn integrally connected with a first component mounting flange 40 in which the mounting apertures 11a (FIG. 1) are disposed. The opposite edge of the center portion 36 is integrally connected with a second, L-shaped component mounting flange 42 in which mounting apertures 11b are disposed.

An end cap 44 is preferably welded, in a slightly recessed position, to each end of the rail 8d so as to cover the cross-sectional area of flange 38. The end cap 44 is preferably dimensioned to provide sufficient clearance between itself and the flange 42 to allow engagement of a support 16 or 26. The end caps 44 provide a mounting surface for optional adhesive-backed electromagnetic shields such as those denoted by reference numerals 96a and 96b (FIG. 1).

The apertures 34c and 34d are preferably fitted with protective linings or grommets 46a and 46b, respectively, to protect cables and wires from rough edges of the apertures 34. Each grommet 46 may consist, for example, of a conventional rubber ring whose outer edge is grooved for engaging the edge of the aperture 34.

The spacing between individual mounting apertures 11, as well as the lateral spacing between and orientation of the mounting flanges 40 and 42, are preferably chosen in accordance with recognized standards for rack-mountable equipment. Such standards are maintained by the Radio, Electronics and Television Manufacturers Association (RETMA) and other entities.

The rails 8 provide a high degree of stiffness once fastened to the vertical supports 16 and 26 (FIG. 1). More specifically, the cross-sections of rails 8 are shaped and dimensioned to yield an increased moment of inertia (as compared to conventional vertical supports), resulting in a corresponding increase in stiffness, while also maintaining compliance with spacing standards for rack-mountable equipment.

Since the moment of inertia equals the product of an area (or mass) times the square of the distance to a reference line, if the distance to the reference line remains constant (e.g., to maintain standard spacing), then the area must increase to realize an increase in the moment of inertia. Referring again to FIG. 2B, the "area" of the rail 8d is the product of the distance between the outer edge of flange 38 and that of flange 42 times the distance between the outer edge of flange 40 and that of center portion 36.

The novel arrangement of flanges 38, 40 and 42 advantageously increases the distance between the outer edge of flange 38 and that of flange 42, thus increasing the moment of inertia and stiffness of the rail 8, while maintaining the desired standard spacing. In a preferred embodiment, the distance between the outer edge of flange 42 and that of flange 38 is preferably approximately 7″ (175 mm) and the distance between the outer edge of flange 40 and flat portion 36 is approximately 2.25″ (57 mm).

Figure 3:
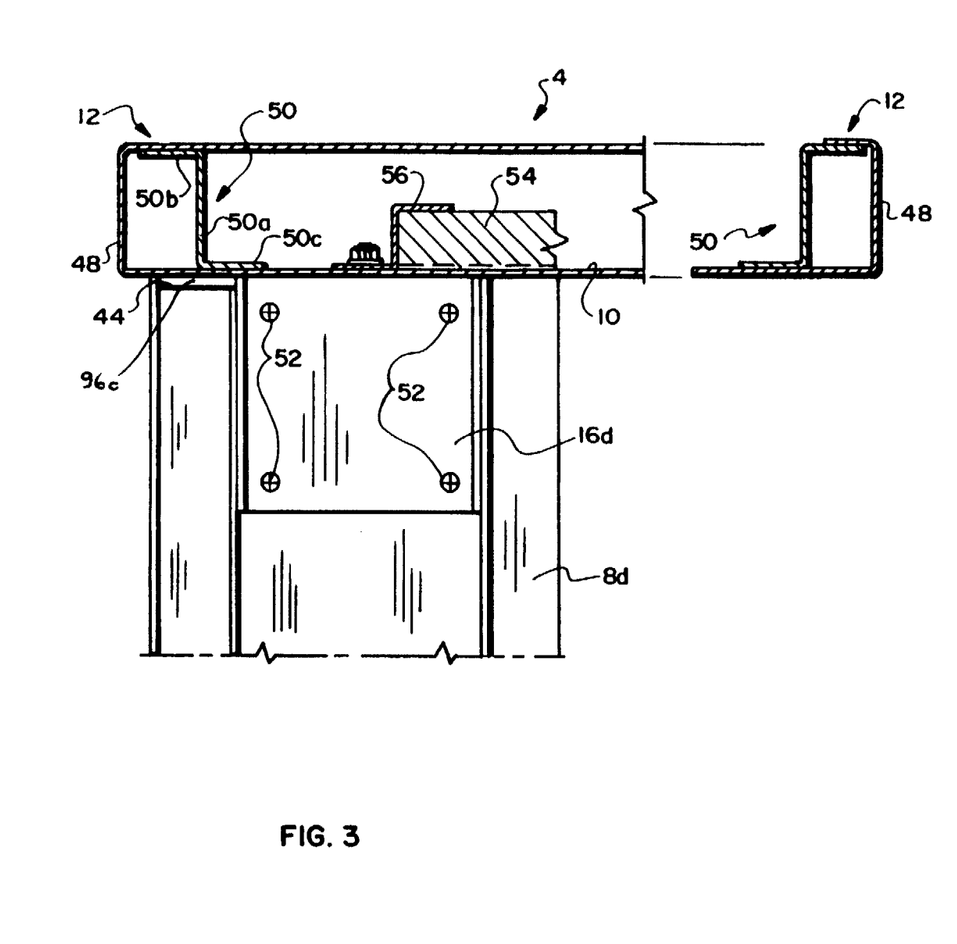
FIG. 3 is an enlarged cross-section taken along line 3—3 of FIG. 1.

As shown in FIG. 3, which is an enlarged section taken along line 3—3 of FIG. 1, the top frame 4 is preferably formed by two metal members. The panel 10 is actually a sheet whose edges 48 are rolled or formed to have a C-shaped cross-section, which edges are preferably flush and welded at the four corners (FIG. 1). A brace 50 includes a vertical portion 50a and two integral horizontal portions 50b and 50c which extend in opposite directions from opposite edges of the vertical portion. Portion 50c is attached to panel 10 while portion 50b is attached to the top surface of the edge 48, thereby forming the tubular perimeter 12. The brace 50 is preferably welded around its perimeter to both the panel 10 and the edges 48. The vertical support 16d is preferably welded to the bottom of perimeter 12 and is fastened by a plurality of rivets 52 to the vertical rail 8d. It should be noted that the top edges of rails 8 are preferably flush with the bottom of tubular perimeter 12, the advantages of which are described below.

The tubular perimeter 12 formed by the combination of edge 48 and brace 50 substantially increases the stiffness of the top frame 4. Consequently, when the supports 16 are rigidly attached to their respective rails 8, the entire top portion of the assembly 2 resists substantial twisting forces.

Top frame 4, and more specifically panel 10, advantageously provides a substantial central area which is unobstructed by structural members or braces. If left as a solid sheet, the panel 10 functions as an effective shield against electromagnetic emissions from within the interior of the assembly 2. The panel 10 is also readily usable for ventilation or other purposes to meet the requirements of a particular application. For example, a portion of panel 10 may be perforated to allow air flow between the ambient atmosphere and the interior of the assembly 2. If such perforations are used, it may be necessary or desirable to cover the perforated area with a screen-type shield 54, secured by a fastener/bracket combination 56, to prevent excess electromagnetic emissions.

Figure 4:
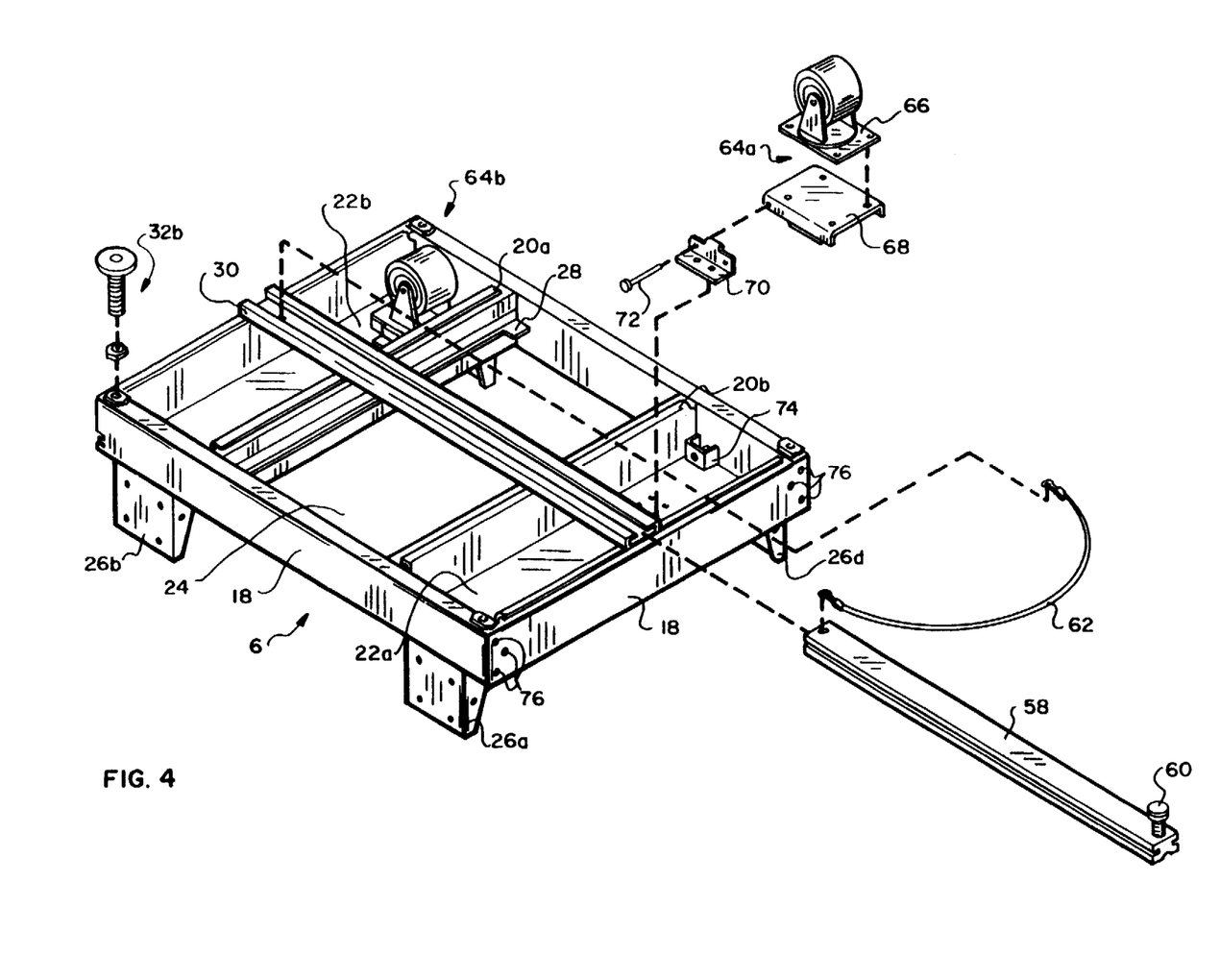
FIG. 4 is a perspective, partially exploded view of the bottom frame of FIG. 1.

FIG. 4 is a perspective view of the bottom frame 6 of FIG. 1, which frame is inverted to show certain features in greater detail. Certain components are omitted for greater clarity.

The stabilizer guide 30 is a channel having a C-shaped cross-section which is dimensioned to slidingly engage an optional stabilizer arm 58 whose sides are slotted along their lengths. One end of arm 58 is fitted with a conventional level adjuster 60 while the other end of the arm is secured by a tether 62 to a point on the guide 30 using a conventional fasteners (not shown). In cases where the frame assembly 2 is heavily loaded, the stabilizer arm 58 may be laterally extended (and level adjuster 60 set) to function as an "outrigger" for enhanced stability. Such enhanced stability may be desirable, for example, when service is being performed upon components mounted within the assembly 2. The tether 62 is preferably a predetermined length which prevents a user from inadvertently extending the arm 58 too far.

Two caster assemblies 64a and 64b are mounted on the bottom of frame 6. It should be understood that, when fully assembled, the frame 6 would actually have a total of four such caster assemblies. Each caster assembly 64 consists of a caster 66 (either swivel or fixed type), a shock-absorbing mounting plate 68, a mounting bracket 70, a pin 72 and a variety of conventional fasteners (not shown) corresponding to the various apertures shown on these components. An anchor 74, disposed in the interior corner between perimeter 18 and tubular member 20b, is used in conjunction with a conventional fastener to secure the pin 72.

Each exterior corner of the bottom frame 6 includes a plurality of apertures 76 which are used in conjunction with conventional pressed-in fasteners to secure structural brackets (not shown) for supporting doors or fastening two frame assemblies together.

Figure 5:
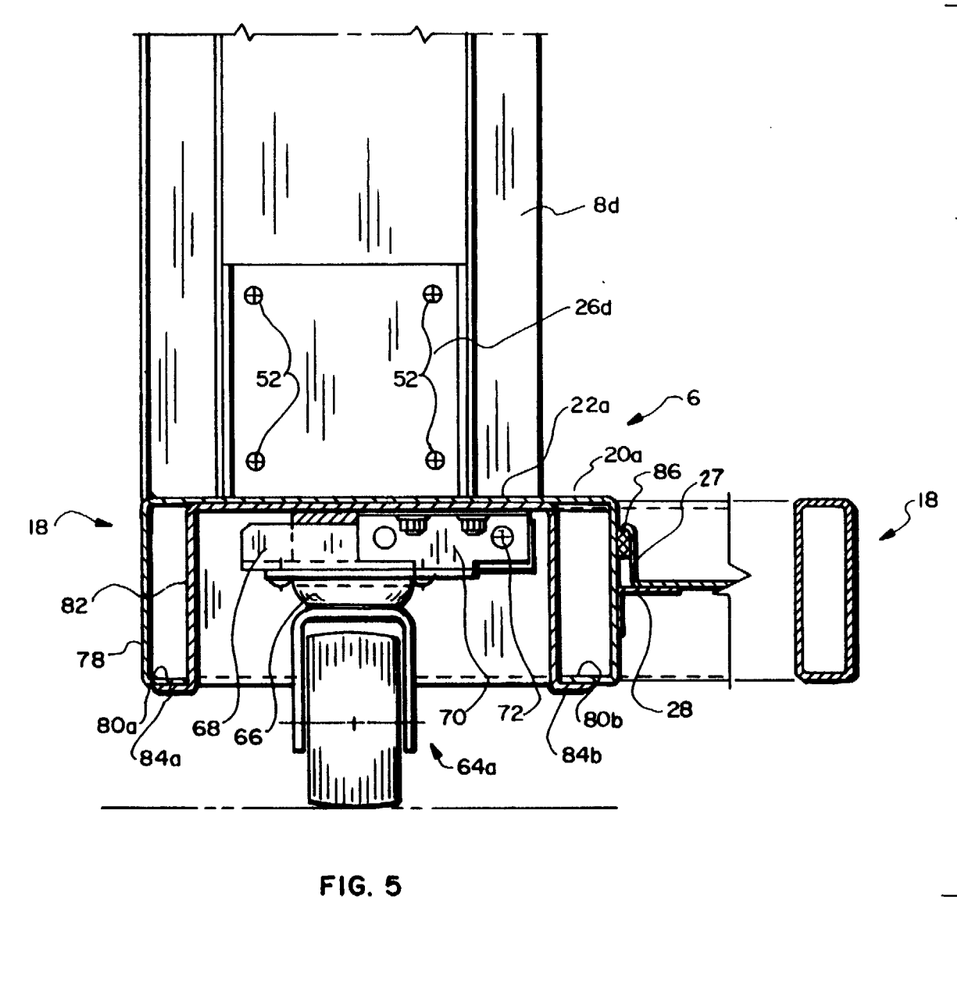
FIG. 5 is an enlarged cross-section taken along line 55 of FIG. 1.

Referring now both to FIG. 4 and FIG. 5, which is an enlarged section taken along line 5—5 of FIG. 1, each half of the bottom frame 6 is preferably formed from two "nested" metal members 78 and 82. Member 78 has an inverted U-shaped cross-section and two inwardly-extending flanges 80a and 80b. Member 82 also has an inverted U-shaped cross-section, somewhat smaller than that of member 78, and two outwardly-extending flanges 84a and 84b which overlap flanges 80a and 80b, respectively. Member 82 thus nests within member 78, thereby forming the tubular perimeter 18 and member 20a. Member 78 is preferably welded to member 80.

Similar to the perimeter 12 of the top frame 4, the tubular perimeter 18 serves to greatly increase the stiffness of the bottom frame 6. Thus, like the top frame 4, the bottom frame 6 tends to make the assembly 2 rigid and resistant to twisting forces. In addition, the perimeter 18 and members 20a and 20b, function as load-bearing members of the assembly 2. Preferably, the bottom of each vertical rail 8 (when attached to one of supports 26) is centered between a portion of the perimeter 18 and the adjacent member 20a or 20b. A primary advantage of this arrangement is that the loads applied by the rails 8 are substantially evenly distributed between the perimeter 18 and the members 20, thus reducing the likelihood of overloading one of the load-bearing members.

The nested members 78 and 82 advantageously provide both the necessary vertical clearance and a suitably flat surface for mounting the caster assembly 64a. In the absence of such vertical clearance, the caster assembly 64a would increase the height of the frame assembly, which may prove unacceptable where uniform frame height is desired. Further, since the tubular perimeter 18 and the member 20a are load-bearing elements, stability and balance are enhanced by locating each caster assembly 64 between such elements and beneath the corresponding vertical rail 8.

The bottom end of rail 8d is flush with surface 22a, just as the top end of rail 8d is flush with the bottom surface of perimeter 12 (FIG. 3). The absence of any gaps between the rails 8 and such surface means that the rails 8 are not free to rotate in a vertical plane separate from the top and bottom frames. That is, any force applied to a rail 8 which urges rotation in the vertical plane will be opposed by the tubular perimeter (or members) of the top and bottom frames, on which the rails 8 bear directly. This arrangement increases the stability of assembly 2.

The panel 27 (FIG. 1) is fastened to the mounting bracket 28. An electromagnetic shield 86 is disposed between the sides of the panel 27 and member 20.

Figure 6:
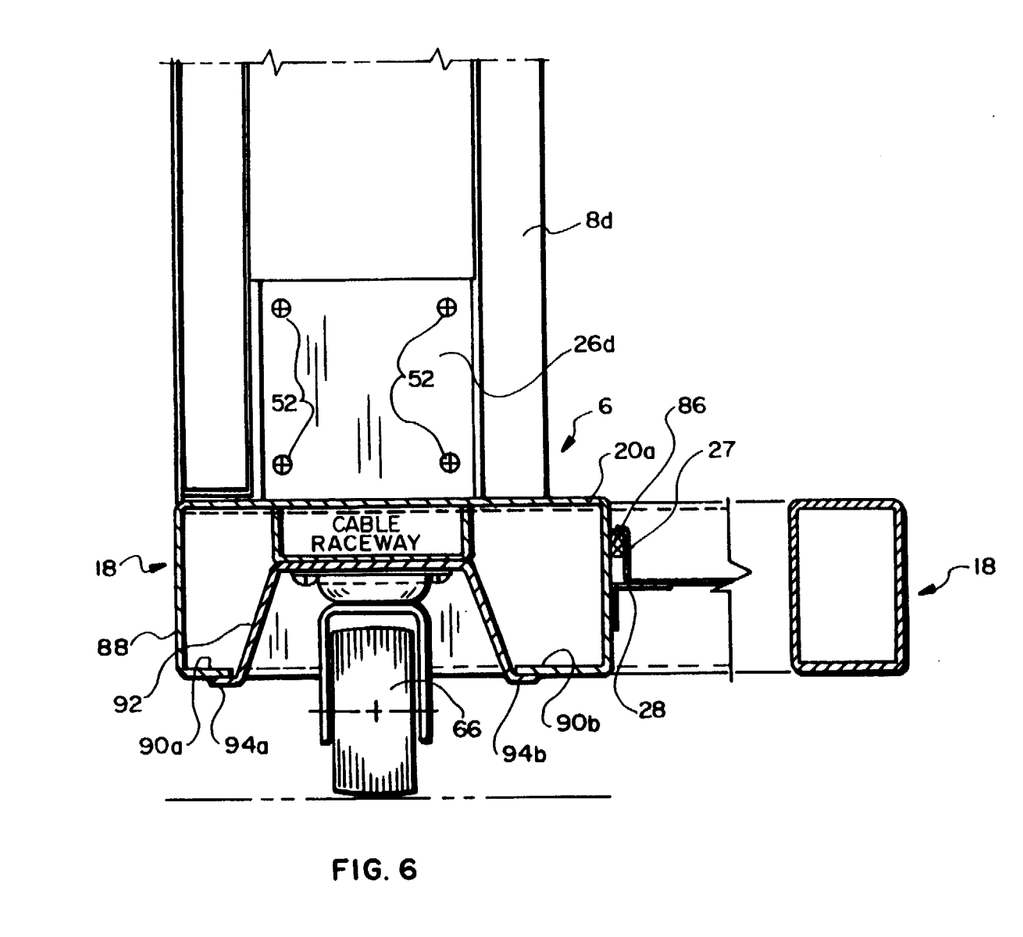
FIG. 6 is an enlarged cross-section of another embodiment of the bottom frame of FIG. 1.

FIG. 6 is an enlarged cross-section of an alternative embodiment of the bottom frame 6. In this embodiment, a caster 66, unaccompanied by a shock-absorbing mount, is used to support the bottom frame 6. Since the caster 66 requires less vertical clearance than the shock-absorbing assembly 64a of FIG. 5, the bottom frame 6 may be formed in a different manner. A metal member 88 is formed with two inwardly-extending flanges 90a and 90b as well as a recessed area denoted "cable raceway" in its top surface. A second member 92 has two outwardly-extending flanges 94a and 94b and is shaped to nest with member 88. When fastened together, preferably by welding, the members 88 and 92 form the tubular perimeter 18 and tubular member 20a, which function as load-bearing elements as described above in connection with FIG. 5. However, the recessed area on top of member 88 is advantageously available for use as a raceway for power or communication cables. The cable raceway may work, in conjunction with apertures 34 (FIG. 1), to route various cables within the interior of the assembly 2.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. A load-bearing frame assembly for rack-mountable equipment, said assembly comprising:
a rectangular top frame comprising a panel having a tubular perimeter which surrounds a substantially unobstructed central area, and four downwardly extending vertical supports attached to the perimeter and disposed, respectively, near the four corners of the top frame, said panel having an integral C-shaped edge and a brace attached thereto, said brace having a vertical portion and two integral horizontal portions extending in opposite directions from opposite ends of the vertical portion and being disposed such that one of said horizontal portions is attached to and bearing upon said panel and the other horizontal portion is attached beneath and supporting an upper portion of the C-shaped edge, whereby the tubular perimeter is formed around said panel;
a rectangular bottom frame comprising a tubular perimeter and two parallel tubular members which span said bottom frame perimeter, thereby defining a substantially unobstructed central area, and four upwardly extending vertical supports attached to said bottom frame perimeter, said bottom frame vertical supports being disposed, respectively, near the four corners of the bottom frame and corresponding in position to the four top frame vertical supports; and
four vertical rails connecting said top and bottom frames, each of said rails connected between a pair of corresponding supports and including means for securing one or more rack-mountable components.

2. The assembly as in claim 1 wherein said top and bottom frames and vertical rails define four vertical areas corresponding, respectively, to four sides of said assembly and all of said vertical areas are substantially unobstructed.

3. The assembly as in claim 1 wherein said top frame panel is perforated for ventilation.

4. The assembly as in claim 1 wherein said top frame further comprises a shield for attenuating electromagnetic energy.

5. The assembly as in claim 1 wherein the ends of said vertical rails each include a shield for attenuating electromagnetic energy.

6. The assembly as in claim 1 wherein the ends of said vertical rails are shaped to engage the vertical supports of the top and bottom frames.

7. The assembly as in claim 1 wherein each of said vertical rails has a cross-section comprising a flat center portion, a first mounting flange integrally connected with one edge of the center portion, a U-shaped flange integrally connected with a second edge of the center portion, and a second mounting flange integrally connected with said U-shaped flange, each of said mounting flanges including a plurality of spaced apart apertures for fastening rack-mountable components.

8. The assembly as in claim 1 wherein one or more of said vertical rails includes at least one aperture for routing power or communication cables therethrough.

9. The assembly as in claim 1 wherein said bottom frame further comprises a laterally-extendable stabilizer.

10. The assembly as in claim 9 further comprising a tether for preventing overextension of the stablizer.

11. The assembly as in claim 1 wherein said bottom frame further comprises two pairs of first and second nesting members each having an inverted U-shaped cross-section and flanged edges which overlap, each of said pairs thereby forming a portion of the tubular perimeter and one of the parallel members.

12. A load-bearing frame assembly for rack-mountable equipment, said assembly comprising:
a rectangular top frame comprising a panel having a tubular perimeter which surrounds a substantially unobstructed central area, and four downwardly extending vertical supports attached to the perimeter and disposed, respectively, near the four corners of the top frame;
a rectangular bottom frame comprising two pairs of first and second nesting members each having an inverted U-shaped cross-section and flanged edges which overlap, thereby forming a tubular perimeter and two parallel tubular members which span said bottom frame perimeter and defining a substantially unobstructed central area, and four upwardly extending vertical supports attached to said bottom frame perimeter, said bottom frame vertical supports being disposed, respectively, near the four corners of the bottom frame and corresponding in position to the four top frame vertical supports; and
four vertical rails connecting said top and bottom frames, each of said rails connected between a pair of corresponding supports and including means for securing one or more rack-mountable components.

13. The assembly as in claim 12 wherein said top and bottom frames and vertical rails define four vertical areas corresponding, respectively, to four sides of said assembly and all of said vertical areas are substantially unobstructed.

14. The assembly as in claim 12 wherein said top frame further comprises a panel having an integral C-shaped edge and a brace attached to the panel, said brace having a vertical portion and two integral horizontal portions extending in opposite directions from opposite ends of the vertical portion, said brace being disposed such that one of said horizontal portions is attached to and bearing upon said panel and the other horizontal portion is attached beneath and supporting an upper portion of the C-shaped edge, whereby the tubular perimeter is formed around said panel.

15. The assembly as in claim 12 wherein said top frame panel is perforated for ventilation.

16. The assembly as in claim 12 wherein said top frame further comprises a shield for attenuating electromagnetic energy.

17. The assembly as in claim 12 wherein the ends of said vertical rails each include a shield for attenuating electromagnetic energy.

18. The assembly as in claim 12 wherein the ends of said vertical rails are shaped to engage the vertical supports of the top and bottom frames.

19. The assembly as in claim 12 wherein each of said vertical rails has a cross-section comprising a flat center portion, a first mounting flange integrally connected with one edge of the center portion, a U-shaped flange integrally connected with a second edge of the center portion, and a second mounting flange integrally connected with said U-shaped flange, each of said mounting flanges including a plurality of spaced apart apertures for fastening rack-mountable components.

20. The assembly as in claim 12 wherein one or more of said vertical rails includes at least one aperture for routing power or communication cables therethrough.

21. The assembly as in claim 12 wherein said bottom frame further comprises a laterally-extendable stabilizer.

22. The assembly as in claim 12 further comprising a tether for preventing overextension of the stabilizer.

23. A load-bearing frame assembly for rack-mountable equipment, said assembly comprising:
   a rectangular top frame comprising a panel having a tubular perimeter which surrounds a substantially unobstructed central area, and four downwardly extending vertical supports attached to the perimeter and disposed, respectively, near the four corners of the top frame;
   a rectangular bottom frame having a tubular perimeter and two parallel tubular members which span said bottom frame perimeter and comprising two pairs of first and second nesting members each having an inverted U-shaped cross-section and flanged edges which overlap, each of said pairs of nesting members forming a portion of the tubular perimeter and one of the parallel members, thereby defining a substantially unobstructed central area, and four upwardly extending vertical supports attached to said bottom frame perimeter and corresponding to the four top frame vertical supports, said bottom frame vertical supports being disposed, respectively, between one of the four corners of the bottom frame and an adjacent one of said tubular members, whereby loads applied to said bottom frame are distributed over said bottom frame perimeter and said tubular members; and
   four vertical rails connecting said top and bottom frames, each of said rails connected between a pair of corresponding supports and including means for securing one or more rack-mountable components.

24. The assembly as in claim 23 wherein said top and bottom frames and vertical rails define four vertical areas corresponding, respectively, to four sides of said assembly and all of said vertical areas are substantially unobstructed.

25. The assembly as in claim 23 wherein said top frame further comprises a panel having an integral C-shaped edge and a brace attached to the panel, said brace having a vertical portion and two integral horizontal portions extending in opposite directions from opposite ends of the vertical portion, said brace being disposed such that one of said horizontal portions is attached to and bearing upon said panel and the other horizontal portion is attached beneath and supporting an upper portion of the C-shaped edge, whereby the tubular perimeter is formed around said panel.

26. The assembly as in claim 23 wherein said top frame panel is perforated for ventilation.

27. The assembly as in claim 23 wherein said top frame further comprises a shield for attenuating electromagnetic energy.

28. The assembly as in claim 23 wherein the ends of said vertical rails each include a shield for attenuating electromagnetic energy.

29. The assembly as in claim 23 wherein the ends of said vertical rails are shaped to engage the vertical supports of the top and bottom frames.

30. The assembly as in claim 23 wherein each of said vertical rails has a cross-section comprising a flat center portion, a first mounting flange integrally connected with one edge of the center portion, a U-shaped flange integrally connected with a second edge of the center portion, and a second mounting flange integrally connected with said U-shaped flange, each of said mounting flanges including a plurality of spaced apart apertures for fastening rack-mountable components.

31. The assembly as in claim 23 wherein one or more of said vertical rails includes at least one aperture for routing power or communication cables therethrough.

32. The assembly as in claim 23 wherein said bottom frame further comprises a laterally-extendable stabilizer.

33. The assembly as in claim 32 further comprising a tether for preventing overextension of the stabilizer.

* * * * *